United States Patent
Publicover et al.

(10) Patent No.: US 7,009,172 B2
(45) Date of Patent: Mar. 7, 2006

(54) METHOD AND APPARATUS FOR IMAGING USING CONTINUOUS NON-RASTER PATTERNS

(75) Inventors: Nelson George Publicover, Reno, NV (US); John Leonard Sutko, Reno, NV (US)

(73) Assignee: Board of Regents of the University and Community College System of Nevada, Reno, Reno, NV (US)

( * ) Notice: Subject to any disclaimer, the term of this patent is extended or adjusted under 35 U.S.C. 154(b) by 0 days.

(21) Appl. No.: 10/795,205

(22) Filed: Mar. 4, 2004

(65) Prior Publication Data
US 2004/0217270 A1    Nov. 4, 2004

Related U.S. Application Data

(60) Provisional application No. 60/452,694, filed on Mar. 6, 2003.

(51) Int. Cl.
*H01J 3/14* (2006.01)

(52) U.S. Cl. .................... 250/234; 205/118; 356/237.3

(58) Field of Classification Search ........... 250/227.26, 250/234–236; 427/553, 595; 205/118, 135, 205/136; 73/105; 356/237.2–237
See application file for complete search history.

(56) References Cited

U.S. PATENT DOCUMENTS

| 5,865,978 | A | * | 2/1999 | Cohen | 205/118 |
| 6,271,916 | B1 | | 8/2001 | Marxer et al. | 356/237.3 |
| 6,606,153 | B1 | * | 8/2003 | Marxer et al. | 356/237.3 |
| 2001/0047682 | A1 | * | 12/2001 | Samsavar et al. | 73/105 |
| 2003/0089162 | A1 | * | 5/2003 | Samsavar et al. | 73/105 |

* cited by examiner

*Primary Examiner*—Stephone B. Allen
(74) *Attorney, Agent, or Firm*—Klarquist Sparkman LLP

(57) ABSTRACT

A method and apparatus for performing data collection within a device is disclosed. A device steers a scanning probe in a continuous, non-raster pattern across a specimen. The specimen is supported by a stage, and data is collected in response to interaction between the probe and the specimen to form a data set. Spiral scanning patterns without turnaround regions are utilized in embodiments of the present invention, both with and without rounded corners in the scanning patterns.

75 Claims, 8 Drawing Sheets outward inward combined

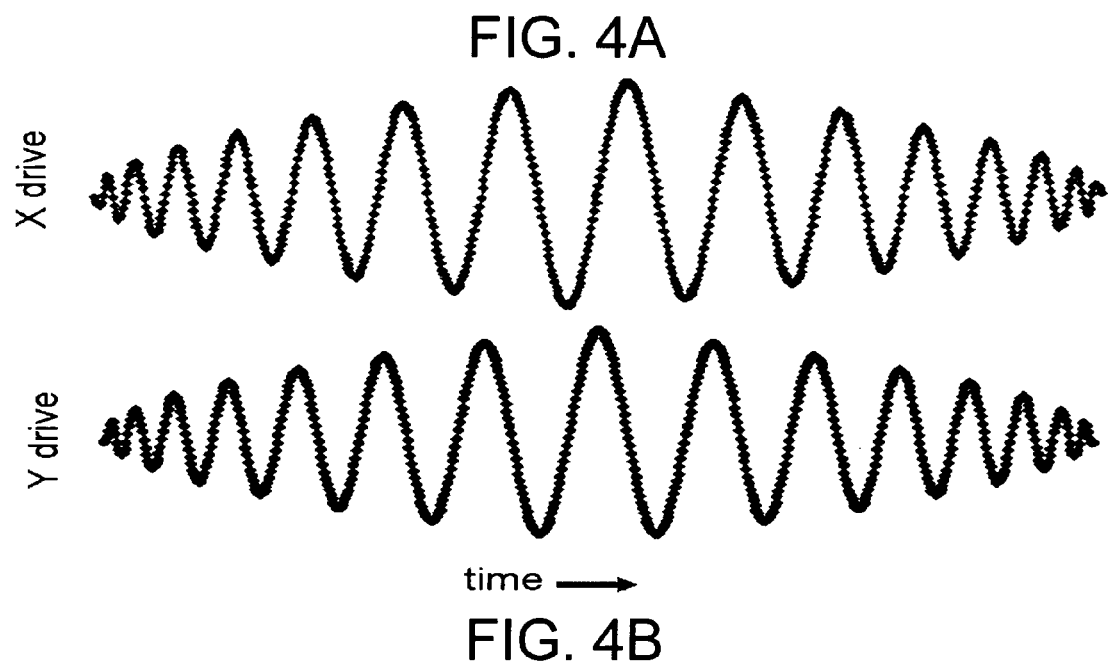

FIG. 7A
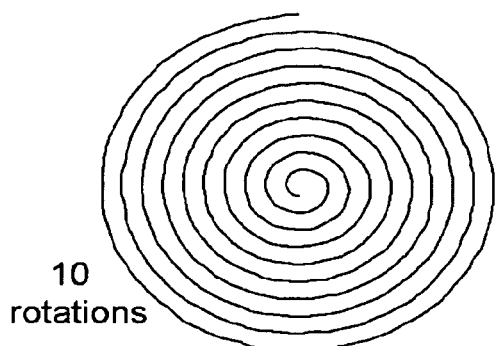
10 rotations
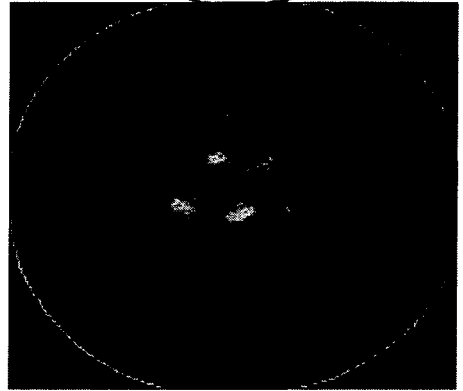
FIG. 7B
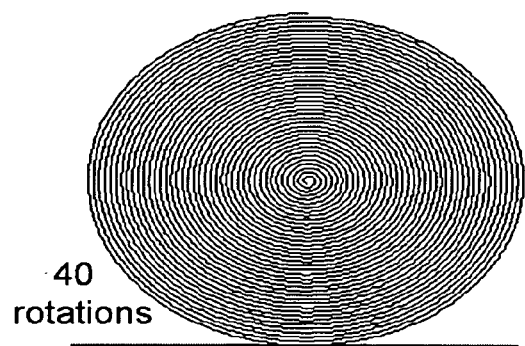
40 rotations
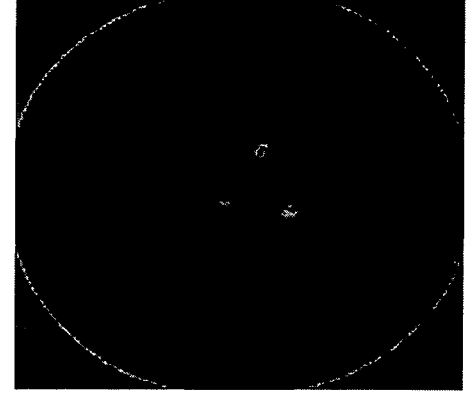

METHOD AND APPARATUS FOR IMAGING USING CONTINUOUS NON-RASTER PATTERNS

RELATED APPLICATION

This application claims priority to U.S. provisional patent application Ser. No. 60/452694, filed Mar. 6, 2003 with the United States Patent and Trademark Office, which is co-pending.

FIELD OF THE INVENTION

This invention relates to the field of scanning microscopy where a specimen is scanned using non-raster, continuous-spiral patterns with particular applications in laser scanning confocal microscope systems as well as beam projection systems.

BACKGROUND OF THE INVENTION

In optical scanning microscopy, a specimen is scanned with a probe by moving a specimen relative to a stationary beam or by moving a beam relative to a stationary specimen. Alternatively, a spinning disk containing an array of apertures can be placed between the light source and the specimen so that regions of the specimen are illuminated in a patterned and sequential manner. One objective of laser scanning confocal microscopy is to realize diffraction limited spatial resolution through the use of strategically placed apertures. The general properties of optical scanning microscope systems are considered in detail in: Theory and Practice of Scanning Optical Microscopy, Tony Wilson and Colin Sheppard (Academic Press, New York, 1984); Confocal Microscopy, edited by Tony Wilson (Academic Press, New York, 1990); and the Handbook of Biological Confocal Microscopy, edited by James B. Pawley (Plenum Press, New York, 1990) and articles referenced therein.

In a number of instances, such as applications involving confocal microscopy, movement of the specimen relative to a fixed illumination source has proven too slow. Therefore, it has become customary to scan a stationary specimen with an illumination light, typically a laser beam, to increase scan rates. Movement of the illumination light along X and Y axes in the plane orthogonal to the optical (Z) axis has most commonly been accomplished using mirrors displaced in space by mechanical devices, such as closed loop and resonant galvanometers. Light that interacts with the sample (by reflection, refraction, fluorescence, etc.) is collected in a serial fashion (i.e. one point at a time) and reconstructed within a computer's memory in order to form an image. The typical pattern to perform this operation is in the form of a raster pattern or 2-dimensional grid produced by rapidly scanning along a straight line in one axis (X direction), then moving the beam one grid location in the orthogonal axis (Y direction), followed by a scan along a parallel straight line in the X axis (in either the forward or reverse direction). Repeated application of this sequence allows the construction of a two-dimensional grid or raster-scanned image of a rectangular field of view. Such an image can readily be viewed on any device organized as a two-dimensional grid display such as a computer screen or television.

An inefficiency of the current technique is caused by the fact that beam-directing devices with inertia cannot instantaneously start or stop their movements. At the end of each line segment, the beam must be directed to retrace or turn around in order to initiate the scanning of a new line. During this time, no useful data are collected. This retrace or turn around time ultimately limits the temporal resolution (i.e. the number of images that can be collected per unit time). The greatest scan rates achieved with this approach have yielded acquisition rates on the order of 30 frames/sec for images containing 512×512 pixels or less. Higher rates can be achieved by decreasing the dimensions of the scanned region. However, even if spatial resolution is compromised by reducing the number of points in each dimension, turn around time severely limits the maximum temporal resolution that can be attained. The ultimate compromise in spatial resolution is the so-called "line scan" in which a beam is simply directed back and forth along a single line. Even during line scans, a significant time is spent in the "turn around" mode.

In another approach for high rate scanning confocal microscopy, acousto-optical beam deflector (AOD) devices, which do not have any moving mechanical parts, have been implemented as beam-steering devices to increase scan speeds. However, this approach is limited by the small deflection angles and the optical properties of AOD devices. In particular, light at different wavelengths is deflected at different angles. Consequently, it is difficult to illuminate the same spot in the specimen simultaneously with different wavelengths of light, and in the case of fluorescence microscopy, light coming from the specimen does not move along the same path as light directed toward the specimen after passing through the AOD. As a consequence, AOD devices are typically not placed in the path of light coming from the specimen and it is not possible to focus light emanating from the image plane in the specimen at a pinhole placed in front of the detector, as is required for true confocal microscopy. Instead, light is often passed through a slit, which permits more out-of-focus light to reach the detector. In this approach, optical performance is sacrificed for speed.

A number of applications, including the observation of any process where changes occur over the period of less than 1 second, would benefit from faster scan speeds than have been achieved to date. In addition, processes that utilize a scanned beam to affect a surface in a spatially organized manner, such as high resolution lithography or image projection systems, would benefit from faster scan rates. Therefore, there is a need to increase the rates at which specimens and/or surfaces are scanned without sacrificing imaging performance such as spatial resolution.

PRIOR ART

U.S. Pat. Nos. 6,606,153 and 6,271,916 to Marxer et al. describe a system for surface inspection in which an object is moved in a spiral pattern. The purpose for this movement is to minimize the distance traveled when inspecting circular wafers and to simplify the optical arrangement to detect scattered light. However, the system is not designed for gathering images at high frame rates and, in general, any system that moves an object solely by moving a stage results in scanning that is considerably slower than one that involves steering a beam.

SUMMARY OF THE INVENTION

The present invention utilizes non-raster scanning patterns to perform rapid probe steering and data collection within imaging devices such as scanning microscopes or beam projection systems such as those used to perform maskless lithography. By using waveforms to direct probe-steering devices in each spatial dimension that are primarily sinusoidal in nature, continuous spiral scanning patterns are generated with a number of advantages. An object of the present invention is to optimize the rate of scanning and/or data collection by increasing the number of data points and/or the number of frames projected or acquired per unit time. In confocal microscopy applications, these high scan rates can be attained without sacrificing the ability to achieve diffraction-limited spatial resolution. The present invention also produces smooth movements to maximize performance and reduce wear and tear on electromechanical scanning devices. The present invention also allows for software-controlled location (i.e. panning), magnification (i.e. zoom), spatial resolution and temporal resolution. By using software algorithms and position feedback signals to determine probe location and orientation, the present invention also optimizes the spatial accuracy of the assignment of pixel locations. The present invention also allows the user to select from a continuous scale between temporal versus spatial resolutions. The present invention also facilitates automated, intelligent probe-steering control in a repeated fashion since the start and end points of each scan are near the same location.

In an embodiment of the present invention, the scanning pattern utilizes an Archimedes' spiral that begins at a central location and spirals out to a desired radius. The beam direction is then turned around and the spiral is connected in a continuous fashion to a second Archimedes' spiral that spirals inward, filling the gap approximately midway between lines generated by the first spiral. The pattern terminates at the central location where the process can be repeated without interruption in the gathering of data. In an alternative embodiment, the scanning pattern utilizes an Archimedes' spiral that spirals out to a specified radius. The pattern then, without changing direction, continuously spirals inward to the center where the sequence can be re-initiated. For maximum temporal resolution during imaging, data gathered during the outward and inward spirals can be used to generate separate frames or images. The outcome is a class of spiral scanning patterns that minimize accelerations needed to produce scanned images and generate serial data streams in which little or no time is lost projecting to, or collecting from, unwanted regions. In embodiments, the present invention can incorporate substantially rectangular spiral patterns, where portions of the spiral pattern are distorted to provide a larger useable area than a round spiral pattern.

Techniques of the present invention can be applied to a variety of other projection or probe devices where beam-steering and/or scanning is performed in a point-by-point (i.e. serial) fashion. In applications such as maskless lithography or image projection systems, the beam can be both rapidly steered and modulated in intensity. In other embodiments, such as in laser- scanning confocal microscopes or scanning probe microscopes, the beam of energy or particles can be made to spiral during data collection. In yet another embodiment, the stage is maintained stationary and a mechanical probe is moved using spiral patterns. In another embodiment, the beam or probe remains stationary and the stage affixed to the sample is moved in a spiral pattern. Embodiments of the present invention combine of these controls in different spatial dimensions.

Other features and advantages of the present invention will be realized from reading the following detailed description, when considered in conjunction with the accompanying figures, in which:

BRIEF DESCRIPTION OF THE DRAWINGS

FIGS. 4A and 4B show X and Y control signals used to generate the spiral in FIG. 3;

FIGS. 7A and 7B show images of fluorescent pollen grains collected using higher temporal resolution (10 spiral rotations, FIG. 7A) versus higher spatial resolution (40 spiral rotations, FIG. 7B);

DETAILED DESCRIPTION OF THE INVENTION

The primary factor that limits the rate at which beam-steering devices can operate is the amount of force required to generate movement. Movement can be computed from a=f/m, where f is the applied force, m is the mass of the moving object (e.g. mirror and any attachment components) and a is acceleration (second time derivative of displacement). Force can be generated by electrical energy to produce displacement in electromechanical devices such as galvanometers. A maximal rate of movement arises because of limitations in the ability to both generate and dissipate electrical power within the small volumes occupied by such beam-steering devices. If attempts are made to expand the size of beam-steering devices, additional limits on the mass or complexity of linkages between the force generating device and the mirror assembly at high displacement rates are imposed due to friction and inertia. In order to keep peak forces low, accelerations (in each dimension, including angular acceleration) need to be minimized. An optimum waveform to keep peak accelerations low is a sinusoid.

In addition to using sinusoidal waveforms to minimize acceleration, many electromechanical and other steering devices such as mirrors can be designed to operate efficiently with sinusoidal control signals. This arises particularly when inertial forces are related to acceleration as described above and restoring forces are related to displacement, generating a relation that can be expressed as a second order differential equation. By taking advantage of resonance characteristics in the frequency domain, performance of such devices can be greatly extended over higher frequencies using sinusoidal waveforms.

If sinusoidal waveforms are used to direct both X and Y movements in a scanning process, elliptical patterns are formed as characterized by Lissajous patterns. If the same frequency is used to control X and Y movements with a phase difference between the sinusoids of 90°, a circle is produced. In order to produce a pattern of nearly sinusoidal waveforms in which a two-dimensional area is scanned, the radius of the circle can be made to vary continuously, but slowly. In Cartesian (x,y) coordinates this can be expressed as $x = a \cdot t \cdot \sin(t)$ and $y = a \cdot t \cdot \cos(t)$, where "a" is a constant that controls how rapidly the pattern spirals away from or toward the central location, and t is the independent variable (i.e. time in this case). In polar coordinates (r, θ), this can be expressed simply as $r = a \cdot \theta$. The pattern generated is a referred to as an Archimedean spiral.

Figure 1:
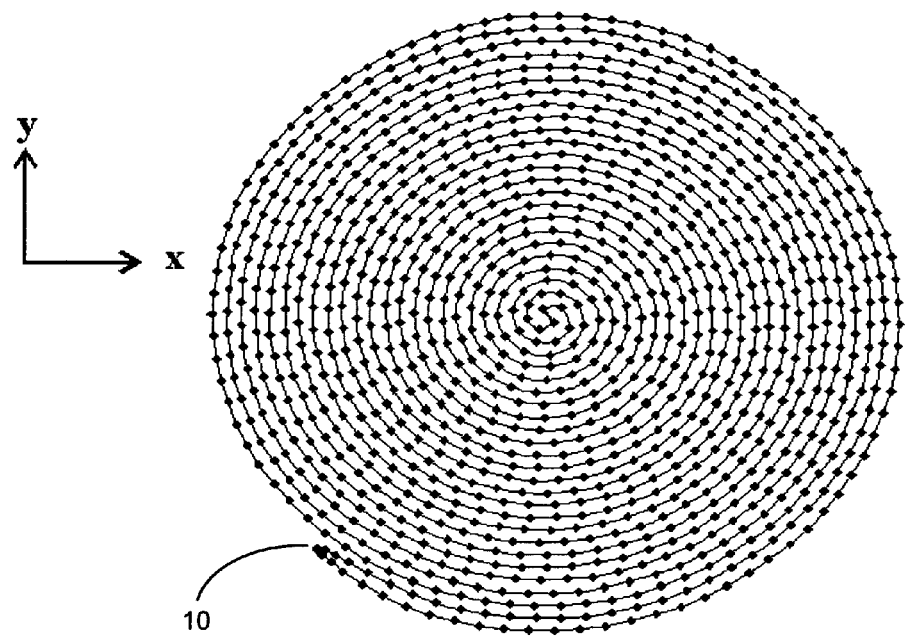
FIG. 1 shows a moderate spatial resolution spiral pattern with approximately 1000 points and a single turnaround region where filled diamond symbols represent the locations of individual samples collected at a constant temporal rate.

There are several ways in which spiral patterns can be employed in order to efficiently scan a two dimensional field of view. Most differences among patterns arise in the manner in which sequential spirals are combined to produce continuous waveforms and uniform spatial coverage while simultaneously minimizing accelerations (particularly peak acceleration). One example of a coupled spiral pattern is shown in FIG. 1, in which there is an outward spiral, followed by an inward spiral midway between the line segments generated by the outward spiral (mathematically performed by offsetting the outward spiral one-half rotation compared to the inward spiral). The two spirals are connected by a single turn-around region where peak accelerations are generated. In comparison, commonly employed raster scans require two turnaround regions per line segment where a typical image might consist of approximately 500 lines (1,000 turnarounds/frame). The spiral pattern illustrated in FIG. 1 generates a single turnaround per frame. In FIG. 1, samples are collected when the beam is located at the positions represented by the filled diamond symbols. Except for the turnaround region 10, the spatial area covered during each sample period is approximately the same throughout the field of view. Sample areas are also distributed uniformly throughout the roughly circular field of view. Together, these attributes produce one objective of the present invention: uniform coverage of the field of view with equal beam dwell time in each region. In confocal microscopy applications, uneven dwell times could cause non-uniform photo-bleaching of a specimen; and in lithography applications could cause non-uniform chemical properties of a photo-resistive coating.

Figure 2A:
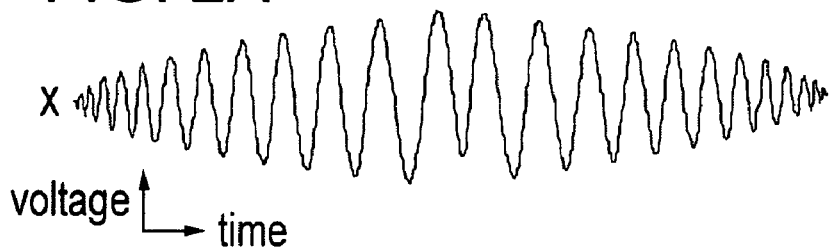
FIGS. 2A and 2B show X and Y control signals used to generate the spiral in FIG. 1.
Figure 2B:
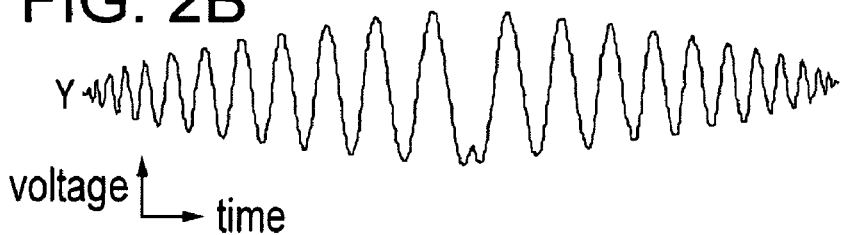

FIGS. 2A and 2B illustrate the X and Y control signals used to generate the spiral in FIG. 1. These typically are voltages (or currents) generated by a digital-to-analog interface within a computer and applied to electromechanical beam-steering devices. Except for the turnaround region at the mid-point of the traces, waveforms consist of slowly varying, amplitude- and frequency-modulated sinusoidal waveforms.

Significant accelerations can develop in turnaround regions. In order to keep forces pointed inward (i.e. toward the central location), reducing the tendency for scanning devices to "run away" due to outward acceleration, it is preferable to generate the outermost spiral first, followed by the innermost spiral. The region of the turnaround region 10 (see FIG. 1) is then generated by predominantly inward-pointing forces, reducing chances for loss of control of the beam-steering device. Another method to reduce peak acceleration is to smooth (i.e. low pass filter) each of the X and Y waveforms in this transition zone. This becomes particularly important at higher image frame rates. A small amount of smoothing has been applied to the spirals in FIG. 1 and FIG. 2 as revealed by the closer spatial separation between sample points in the turnaround region. Differences in the inward versus the outward beam paths of the spirals can differ slightly due to the forces involved in accelerating some galvanic scanning devices. Multiplication of the "a" term by a small correction factor (i.e. close to 1) for either the inward or outward spiral can be used to correct such differences.

Figure 3A:
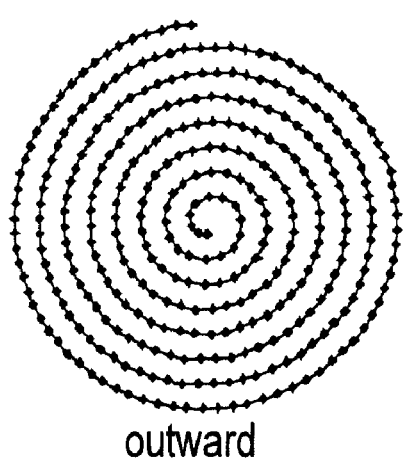
FIG. 3A–3C show an alternative continuous spiral patterns with no turnaround region where filled diamond symbols represent the locations of sample points.
Figure 3B:
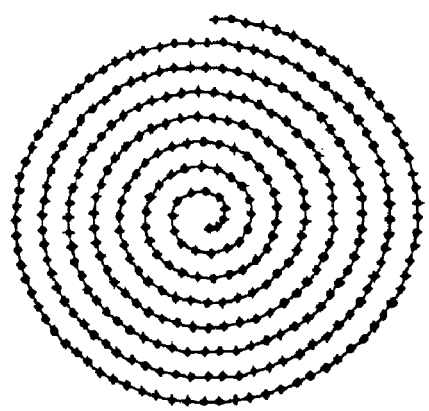
Figure 3C:
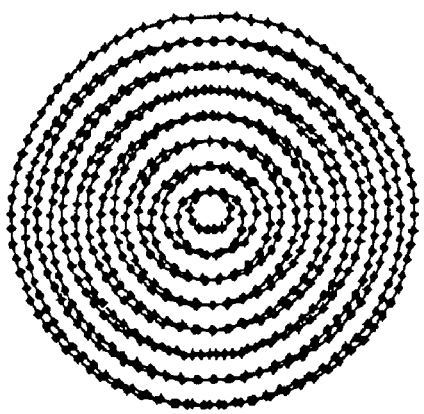

FIGS. 3A–3C shows an alternative continuous spiral pattern in which there are no turnaround regions. The scanning pattern spirals out to a specified radius and, without changing direction, continuously spirals inward to the center where the sequence can be re-initiated. Separate images can be generated from the inward and outward spirals (FIGS. 3A and 3B). This pattern and sequence is optimum for the highest frame rates. A minor disadvantage of this method is that the positions of the spiral data set for all even numbered frames differ somewhat from sample positions for odd numbered frames. This can be avoided by computing a single frame from the combination of inward and outward spiral samples (FIG. 3C) at the expense of halving the maximum frame rate.

FIGS. 4A and 4B, respectively, show the X and Y control signals used to generate the spiral pattern illustrated in FIG. 3. Control signals typically consist of slowly varying, amplitude- and frequency-modulated sinusoidal waveforms optimized for driving beam-steering devices at high frequencies.

In most cases (except in turnaround regions), it is desirable to have a uniform distance between sample points along the spirals. In scanning microscopes, this distance corresponds to one axis of an area scanned during a sample period. The dimension of the other axis of the scanned area is governed by the size of the illuminating spot (which is largely dictated by the numerical aperture of the objective lens and the point spread function of the illumination system. An analytic solution to compute uniform distance along the spiral is mathematically difficult. Integration of the distance along a spiral was only partially solved by Archimedes (the reason for the namesake) more than 2 centuries ago and remains not fully resolved today. However, numerically it is possible to compute distances, Δd, between adjacent sample points as:

$$\Delta d = \sqrt{(x_i - x_{i-1})^2 + (y_i - y_{i-1})^2} \tag{1}$$

If t is the independent variable and coordinate $(x_{i-1}, y_{i-1})$ has been computed as the $t_{i-1}$ sample point along the spiral, then the next value $t_i$ at coordinate $(x_i, y_i)$ can be computed by a successive approximation scheme. By starting at value $t_{i-1}$ and initially choosing a temporary t value that is always greater than the desired separation, a range can be established. An example of a simple formula for the increment, $\Delta t = t_i - t_{i-1}$, that is approximately double the actual increment, is:

$$\Delta t = \left( \frac{0.4}{t_{i-1} + 0.1} + 0.4 \right) \cdot \Delta d \tag{2}$$

where $t_{i-1}$ is expressed in rotations and Δd is the desired separation distance. A value of t midway between the two end-points of the range can then be tested using the formula for distance above. The range can be divided in half, based on whether the distance is greater than or less than the desired separation. This binary-search process can be repeated until a desired accuracy is achieved.

In some spiral projection and imaging applications (e.g. maskless lithography) it is desirable to control beam intensity at each sample location. Beam modulation can be performed in a variety of ways (e.g. shutter, AOD) where electronic modulation of modem solid state lasers provides an ideal method for pattern projection. Modulation can be on/off or in a continuous (i.e. analog) mode to produce precise intensity control. By separately modulating and combining multiple beams with different wavelengths, it is also possible to project multi-colored displays. Data acquisition at each spiral location can also involve simultaneously acquiring multiple display images. Data acquisition can include intensity values at different wavelengths (e.g. using optical filters) or some other attribute of the acquired signals (e.g. polarization properties, time delay between excitation and emission during fluorescence lifetime measurements).

Figure 5:
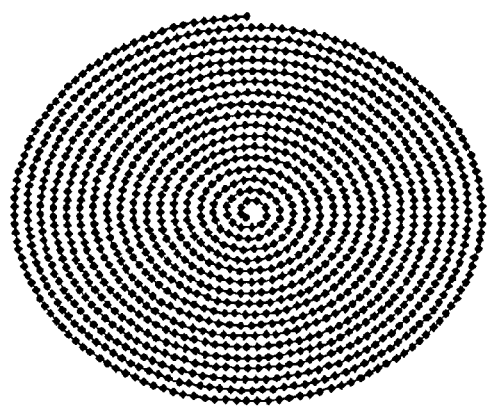
FIG. 5 shows the sample locations of a spiral data acquisition sequence.
Figure 6:
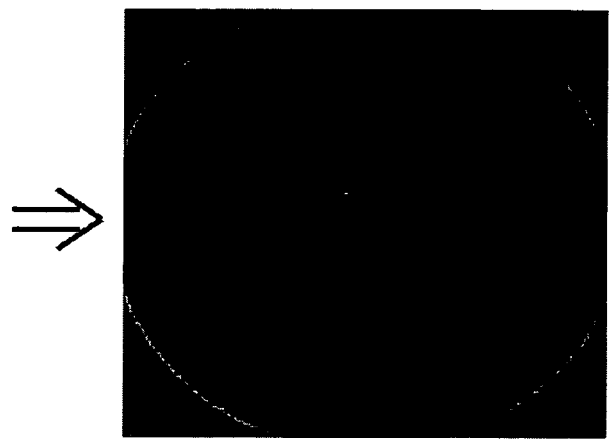
FIG. 6 shows an image of a fluorescent pollen grain generated by mapping spiral data points of FIG. 5 to a raster image.

A practical consideration in order to generate images (e.g. on a computer screen) arises from the fact that sampled data from spiral patterns are generally not aligned with the two-dimensional grid or "raster" structure of most display devices. The requirement to map samples collected in a spiral pattern to a raster space is illustrated in FIG. 5. In this case, a fluorescently- labeled pollen grain (FIG. 6) was sampled at the spiral locations represented by filled diamonds 20 in FIG. 5.

One method to translate between the spiral data set and a two-dimensional grid of pixels appropriate for display devices such as computer monitors and television screens is to use a weighted average of nearest sample points. This can be implemented by finding the "n" nearest sampled (i.e. spiral) data points to each two-dimensional display pixel. By weighting the spiral data points (e.g. inversely proportional) to the distance between the location of the spiral point and the location of the display pixel an accurate representation of the spiral data with smooth transitions in the grid display can be generated. Proper weighting also includes ensuring that the sum of the weighting factors at each location is equal to 1, or some constant value if contrast gain is desired. For example, we have found that using 4–5 nearest points produces adequate images. The mapping of data samples collected at locations 20 in FIG. 5 to raster pixels illustrated in FIG. 6 was performed using this method.

A second general method to map a spiral data set to a two-dimensional display is by finding the "n" nearest two-dimensional display pixels to each sampled (i.e. spiral) data point. As in the first scheme, the influence of each newly acquired sample on nearby raster pixels can be weighted (e.g. inversely proportional) to the distance between the location of the spiral point and the location of the display pixel. In addition, the time since pixels were last updated can be taken into account. An advantage of this scheme is that most of the computation required to produce raster images can be performed one point at a time, as each sample is acquired.

A significant advantage of schemes to map spiral data to raster images is the fact that the number of "spiral" data points sampled can be independent of the number of display pixels. If high temporal resolution (i.e. a high frame rate) is desired, then a small number of data points along the spiral pattern can produce a roughly uniform distribution of samples within an approximately circular field of view. If high spatial resolution is desired, then more spirals as well as more data points along the spirals can be selected. When tracking rapid dynamic behaviors or making comparisons with spatial-temporal mathematical models, the spiral pattern can be used to select just enough spatial resolution while maximizing temporal resolution. The number of sample points per image and frame rate can be chosen to be any values on a continuous scale (i.e. single points can be added or subtracted). Maximum values are governed only by sinusoidal scanning frequency and signal gathering limitations, not by the characteristics of display devices.

As an example using a spiral pattern with a scanning confocal microscope, if (in order to gather enough photons) each sample required a dwell time of 0.5 microseconds and 2000 samples were needed for adequate spatial resolution, then a frame rate of 1000 frames/second could be achieved. Even higher frames rates can be chosen completely under software control (i.e. with no modifications to hardware). Maximal two-dimensional scan rates using raster (i.e. grid) patterns are generally more than an order of magnitude slower in today's microscopes.

Another significant advantage of the spiral method is the use of the actual position feedback signal from the electro-mechanical scanning device to dictate the (x,y) position of each sample collected. This is particularly important at higher frame rates when there are larger differences between command voltages and actual position (as measured using a position sensor). Any changes in the performance of scanning devices, such as those that often occur running at different frequencies or due to changes in temperature or wear, can be bypassed using the position feedback signal. Corrections can also be included for spatial aberrations generated by lenses or other components of the beam pathways. Using the spiral method with position feedback, there is no longer a requirement to have precise control over the time or locations of data samples to correspond to exact grid positions. Every position within every frame is determined (and can be adjusted on a continuous scale) on a sample-by-sample basis. Consequently, it is not necessary to generate a pixel clock signal to control data acquisition, nor is it necessary to discard data obtained during periods of nonlinear velocities, such as occur during the turn-around intervals of a raster scanning system.

The spiral pattern approach allows magnification (i.e. by controlling the spiral radius), X-Y location (i.e. by adding offsets), spatial resolution (i.e. number of samples per spiral and number of spirals) and temporal resolution (i.e. by controlling the number of samples and sample rate) to all be implemented under software control. Switching any of these characteristics can be performed rapidly; for example, to "zoom in" during the tracking of quickly moving or dynamically changing (or combinations of both) objects within a field of view. The ability to acquire images at a high frame rate and/or to adjust spatial resolution within selected regions of a field of view is a crucial element of imaging systems designed to track high velocity missiles or dynamically changing particles. As an example, FIGS. 7A and 7B illustrate images that have been collected using different spiral resolutions and different frame rates. A decreased number of spirals allows higher frame rates to be achieved (FIG. 7A) whereas an increased number of spirals generates higher spatial resolution within each image (FIG. 7B).

Various non-raster patterns can be used in alternative embodiments of the present invention. For example, if a more rectangular field-of-view is desired (because of the shape of a particular specimen or field-of-view compatibility with other analysis software), the p (or power) term in equation 3 below, can be set to a value between 0 and 1.

$$x = a \cdot t \cdot \sin^p(t)$$
$$y = a \cdot t \cdot \cos^p(t) \quad (3)$$

Figure 8:
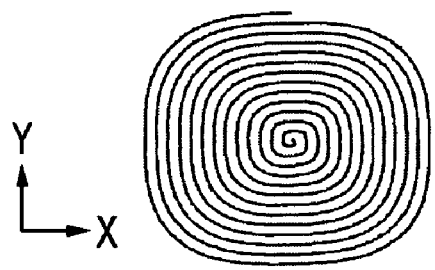
FIG. 8 illustrates a non-raster scanning pattern having rounded corners.

The pattern at p=0 is an expanding square and p=1 has been used to compute the rounded patterns in FIGS. 3A–3C. Intermediate "square spiral" patterns with p=0.7 and 0.6 are shown in FIGS. 8 and 12B. Both x and y accelerations (related to $\Delta(\Delta x)$ and $\Delta(\Delta y)$, respectively, see FIG. 12B) increase somewhat in regions near the rounded corners, but in may cases, these can be maintained within the performance specifications of beam steering devices.

Figure 9A:
FIGS. 9A and 9B illustrate x and y control signals for generating the scanning pattern shown in FIG. 8.
Figure 9B:
Figure 10A:
FIGS. 10A and 10B show the overall amplitudes of X and Y control signals.
Figure 10B:
Figure 11A:
FIGS. 11A and 11B show acceleration of X and Y control signals.
Figure 11B:
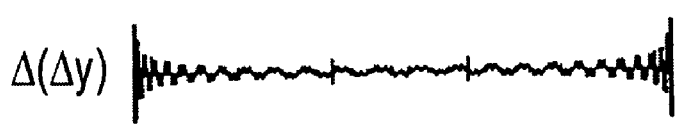

FIG. 8 shows an outward spiral (inward spiral removed for clarity) where sine and cosine terms are raised to the power 0.7. Individual x and y control signals are shown in FIGS. 9A and 9B. The pattern maintains uniform spacing, but fills in the corners of a square field-of-view. Because of the uniform distance between samples, the overall amplitudes of $\Delta x$ and $\Delta y$ (FIGS. 10A and 10B) are independent of frequency. In this class of patterns, there is an increased (but manageable, particularly in the region of the outer spirals) acceleration (i.e. proportional to $\Delta(\Delta x)$ and $\Delta(\Delta x)$, shown in FIGS. 11A and 11B) in the corner regions.

Figure 12A:
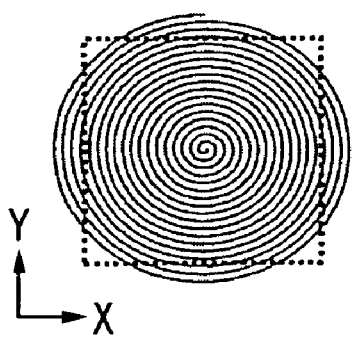
FIGS. 12A and 12B illustrate rectangular areas covered by round versus square spiral patterns.
Figure 12B:
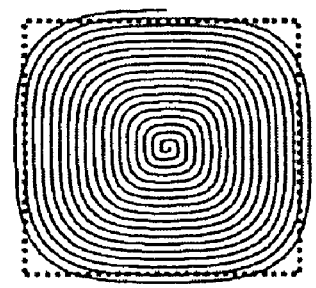

FIGS. 12A and 12B illustrate useable rectangular areas covered by round (FIG. 12A) versus "square" (FIG. 12B) spiral patterns. Both of the spiral patterns of FIGS. 12A and 12B)contains 18 revolutions reaching the same radius. The square spiral of FIG. 12B was computed using p=0.6. Dashed-lines enclose areas where nearest sample point estimates of intensity can reasonably be computed for all pixels within the region. In this example, the useable rectangular area of the square spiral in FIG. 12B is 30% greater than the round spiral in FIG. 12A.

Figure 13:
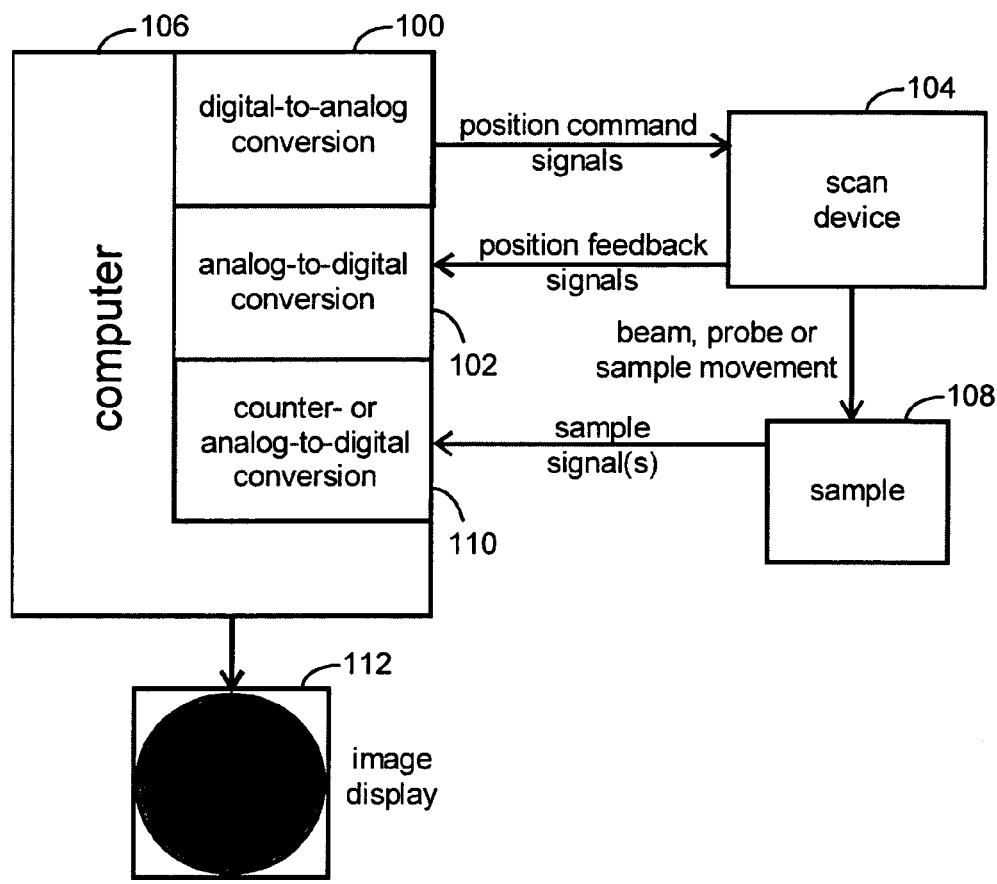
FIG. 13 shows in block diagram form a general hardware arrangement and flow of information during spiral imaging.

FIG. 13 illustrates an exemplary, overall arrangement of hardware and flow of data during spiral imaging. Embodiments utilizing the hardware arrangement shown in FIG. 13 can include confocal laser-scanning microscopes, near field microscopes, and atomic force microscopes. In an embodiment, spiral patterns are computed and sent to a scan device via digital-to-analog converter 100. Optionally, the actual position coordinates of the scanning device can be fed back to the computer via an analog-to-digital converter 102 for use in generating display images. Scan device 104 moves a probe, such as a beam and/or the sample 108 according to the computed spiral command signals. Signals collected from the sample (e.g. light) are collected by computer 106 using counters 110 (e.g. photon counting) and/or analog-to-digital conversion 102. The automated scheme can be implemented in a variety of imaging devices that are capable of deflecting a beam or probe, or moving a stage using spiral patterns. Intensity (e.g. light) signals are registered with the position coordinates (either command or feedback) to generate raw data sets for storage and/or display. Raw spiral data sets can be displayed on a raster terminal using a weighed averaging scheme, as described above. Images, displayed 112 either singly or as a video sequences, show a roughly circular (reflecting the spiral pattern) field of view.

Figure 14:
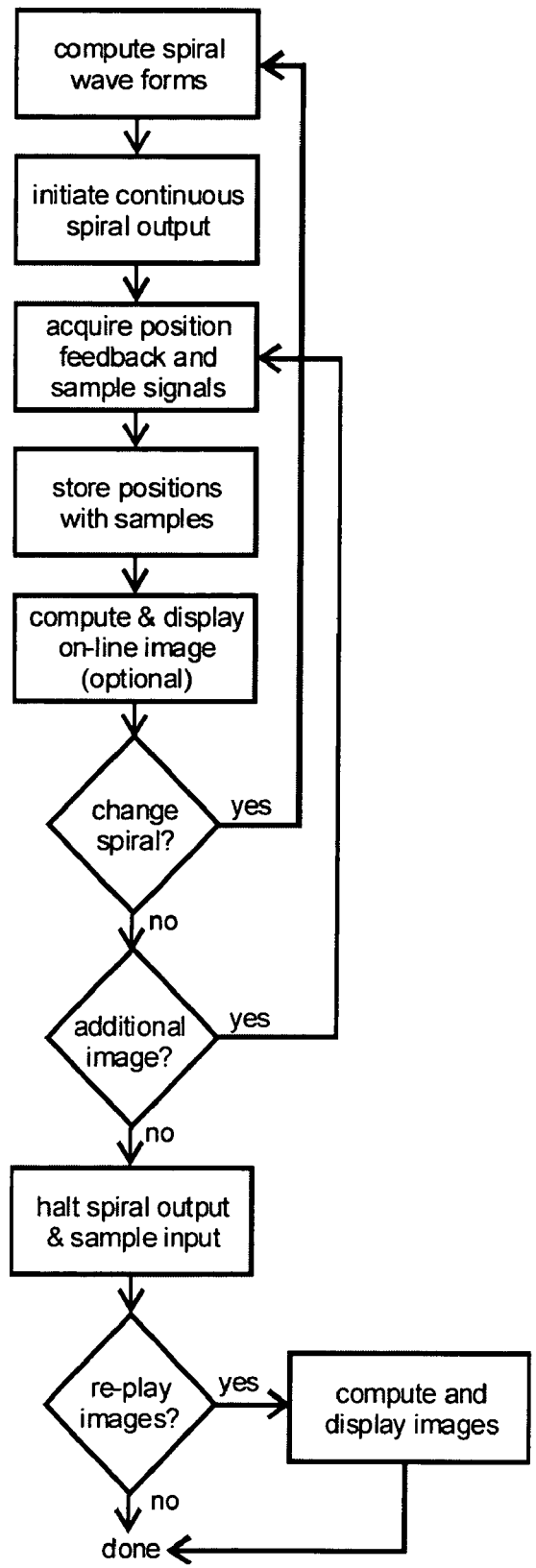
FIG. 14 shows in flow diagram form an execution sequence for data acquisition and display in an embodiment of the present invention.

FIG. 14 shows an overall flow diagram of an algorithm capable of generating spiral control signals, acquiring/storing spiral image data and displaying spiral data on a conventional (raster) monitor. The algorithm can use different techniques (as described above) to map spiral data to raster images depending on the need for high display frame rates (e.g. during on-line monitoring) or for image accuracy (e.g. during off-line display).

In the case of optical microscopy applications, the spiral approach can be used for fluorescence imaging involving single photon activation, where descanning of the collected light is required for confocal imaging, or using multi-photon activation where descanning of the emitted light is not necessary. Spiral movement can be implemented using a number of beam-steering devices such as closed-loop galvanometers coupled to mirrors, piezoelectric actuated dual axis mirrors, and single- and dual-axis MEMS (microelectromechanical system) micro-mirrors. In each case, the sinusoidal control waveforms allow the rate and accuracy of beam-steering to be improved.

While a method and apparatus for performing imaging using continuous, non-raster scanning patterns have been illustrated and described in detail, many modifications can be made to embodiments of the present invention without departing from the spirit thereof.

What is claimed is:

1. A method for producing an image of a specimen, comprising:
   placing a probe relative to a specimen, the probe being configured to facilitate production of respective image data at each sample area at which the probe is situated relative to the specimen;
   moving at least one of the probe and specimen relative to the other, within a two-dimensional field of view, in a continuous, non-raster scanning path from sample area to sample area in a sequential manner in the field while producing the respective image data, the sample areas being distributed substantially uniformly throughout the field so as collectively to cover the field and to provide substantially uniform spatial coverage per sample area in the field; and
   producing an image from the image data.

2. The method of claim 1, comprising moving the probe relative to the specimen along the scanning path.

3. The method of claim 1, comprising moving the specimen relative to the probe along the scanning path.

4. The method of claim 1, wherein the respective image data are produced by the probe.

5. The method of claim 1, wherein the respective image data are produced by directing energy at the sample area.

6. The method of claim 5, wherein the energy is directed at the sample area by the probe.

7. The method of claim 5, further comprising modulating the energy as the energy is directed at the sample area.

8. The method of claim 7, wherein modulating the energy comprises modulating an intensity of the energy as the energy is directed at the sample area.

9. The method of claim 5, wherein the energy comprises at least one light beam.

10. The method of claim 9, wherein the at least one light beam comprises at least one laser beam.

11. The method of claim 1, wherein the probe is a mechanical probe.

12. The method of claim 1, wherein the respective image data are produced by detecting energy received from the sample area.

13. The method of claim 12, wherein the probe produces the respective image data by detecting the energy received from the sample area.

14. The method of claim 1, wherein the scanning path is a spiral path.

15. The method of claim 14, wherein the spiral path is an Archimedean spiral path.

16. The method of claim 14, wherein the spiral path is a square-spiral path.

17. The method of claim 14, wherein the spiral path comprises an inward spiral path coupled to an outward spiral path.

18. The method of claim 17, wherein a single image of the field is produced over a cycle comprising one inward spiral path and one outward spiral path.

19. The method of claim 18, wherein:
the inward spiral path has a starting point and an ending point, and the outward spiral path has a starting point and an ending point; and
the starting point of each spiral path is adjacent the ending point of the other spiral path of the cycle.

20. The method of claim 17, wherein a first image of the field is produced during the motion over the inward spiral path, and a second image of the field is produced during the motion over the outward spiral path.

21. The method of claim 17, wherein the inward and outward spiral paths are coupled to each other by at most two turnarounds.

22. The method of claim 17, wherein the inward spiral path has a rotational direction that is opposite a rotational direction of the outward spiral path.

23. The method of claim 14, wherein the spiral path comprises at most two turnarounds.

24. The method of claim 1, wherein at least one of the probe and specimen are moved relative to the other, within a field of view, so as to provide substantially equal dwell time per sample area along the scanning path.

25. The method of claim 1, wherein the sample areas along the scanning path are substantially equally spaced relative to each other.

26. The method of claim 1, wherein producing the image comprises mapping the image data obtained for the respective sample areas along the scanning path to a raster space comprising a substantially uniform grid of multiple pixels.

27. The method of claim 26, wherein mapping the image data comprises weighting, for each pixel of the grid, the data from nearest sample areas to the pixel, the weighting being based on respective distances of the sample areas to the pixel.

28. The method of claim 26, wherein mapping the image data comprises determining, for each sample area, "n" nearest two-dimensional pixels.

29. The method of claim 26, further comprising displaying the raster space.

30. The method of claim 1, further comprising determining respective coordinates associated with each sample area along the scanning path as data are being produced at the respective sample area.

31. The method of claim 30, wherein the coordinates are respective X,Y coordinates.

32. The method of claim 30, further comprising:
producing, from the determined coordinates, respective feed-back data concerning probe position; and
determining, from the respective feed-back data, respective positions of the sample areas in the field.

33. The method of claim 1, further comprising changing a magnification of the produced image by correspondingly changing an amplitude of command signals defining the scanning path.

34. The method of claim 1, wherein the respective image data for each sample area are produced by performing multiple data samplings of the sample area before proceeding to the next sample area along the scanning path.

35. The method of claim 34, further comprising producing a particular spatial resolution of the produced image by performing at least one of (i) a corresponding number of data samplings of the sample areas along the scanning path, and (ii) a corresponding number of rotations along the scanning path.

36. The method of claim 34, further comprising producing a particular temporal resolution of the produced image by performing a corresponding rate of data samplings of the sample areas along the scanning path.

37. A method for producing an image of a specimen, comprising:
placing a probe relative to a specimen, the probe being configured to facilitate production of respective image data at each sample area at which the probe is situated relative to the specimen; and
according to respective sinusoidal first-dimension-control signals and sinusoidal second-dimension-control signals, moving at least one of the probe and specimen relative to the other, within a field of view, in a continuous, non-raster scanning path in two-dimensional space from sample area to sample area in a serial manner in the field while producing the respective image data, the sample areas being distributed substantially uniformly throughout the field so as collectively to cover the field and to provide substantially uniform spatial coverage per sample area in the field.

38. A method for producing an image of a specimen, comprising:
placing a probe relative to a specimen, the probe being configured to facilitate production of respective image data at each sample area at which the probe is situated relative to the specimen;
moving at least one of the probe and specimen relative to the other, within a field of view, at least one cycle of a continuous, non-raster scanning path in two-dimensional space from sample area to sample area in a serial manner in the field while producing the respective image data, the sample areas being distributed substantially uniformly throughout the field so as collectively to cover the field and to provide substantially uniform spatial coverage per sample area in the field, and the scanning path in each cycle having at most two turnarounds;
monitoring position of at least one of the probe and specimen at each sample area in the field; and
producing an image from the image data.

39. A device for producing an image of a specimen, comprising:
a specimen holder configured to hold a specimen;
a probe configured to be placed relative to the specimen and to facilitate production of respective image data at each sample area at which the probe is situated relative to the specimen; and
a scanning device coupled to at least one of the probe and specimen holder and configured to move the at least one of the probe and specimen holder, relative to the other and within a two-dimensional field of view, in a continuous, non-raster scanning path from sample area to sample area in a serial manner in the field while the respective image data are being produced, the sample areas being distributed substantially uniformly throughout the field so as collectively to cover the field and to provide substantially uniform spatial coverage per sample area in the field.

40. The device of claim 39, wherein the scanning device is coupled to and is configured to move the probe, relative to the specimen, along the scanning path.

41. The device of claim 39, wherein the scanning device is coupled to and is configured to move the specimen holder, relative to the probe, along the scanning path.

42. The device of claim 39, wherein the probe is configured to produce the respective image data.

43. The device of claim 42, wherein the probe is configured to direct energy at the sample area.

44. The device of claim 43, wherein the probe comprises an energy source configured to produce at least one energy beam directed by the energy source to the sample area.

45. The device of claim 44, further comprising a beam-modulator connected to the probe and configured to modulate the energy beam as the energy beam is being directed by the probe to the sample area.

46. The device of claim 44, wherein the energy beam comprises at least one laser beam.

47. The device of claim 42, wherein the probe comprises a detector situated and configured to detect energy received by the detector from the sample area.

48. The device of claim 47, wherein the probe is configured to direct energy at the sample area.

49. The device of claim 42, wherein the probe is a mechanical probe.

50. The device of claim 39, wherein the scanning device is configured to move the at least one of the probe and specimen holder, in the field of view, in at least one cycle comprising a respective spiral scanning path.

51. The device of claim 50, wherein the spiral scanning path is an Archimedean spiral path.

52. The device of claim 50, wherein the spiral scanning path comprises an inward spiral path coupled to an outward spiral path.

53. The device of claim 52, wherein the inward and outward spiral paths are coupled to each other by at most two turnarounds.

54. The device of claim 50, wherein the spiral path comprises at most two turnarounds.

55. The device of claim 39, further comprising a computer that is configured to receive the image data and to process the image data to a form usable for producing an image, from the received image data, of the scanned field of view.

56. The device of claim 55, wherein the computer comprises a converter configured to convert the received data, obtained along the non-raster scanning path in the field of view, to a raster space comprising a substantially uniform grid of multiple pixels.

57. The device of claim 56, further comprising a display device coupled to the computer so as to display the pixels in a manner discernible as an image of the field of view.

58. The device of claim 56, wherein the computer is further configured to weight, for each pixel of the raster space, data from nearest sample areas to the pixel, the weighting being based on respective distances of the sample areas to the pixel.

59. The device of claim 56, wherein the computer is further configured to determine, for each sample area in the field of view, "n" nearest two-dimensional pixels for display.

60. The device of claim 55, wherein:
  the computer is configured to produce respective sinusoidal first-dimension-control signals and sinusoidal second-dimension control signals; and
  the scanning device is configured, in response to the sinusoidal first and second dimension-control signals, to move the at least one of the probe and specimen holder in the continuous, non-raster scanning path in the first and second dimensions in the field.

61. The device of claim 60, wherein respective sinusoidal first-dimension-control signals and sinusoidal second-dimension control signals include a variable parameter selected from the group consisting of amplitude and frequency.

62. The device of claim 39, wherein the scanning device is further configured to determine respective coordinates associated with each sample area along the scanning path as data are being produced at the respective sample area.

63. The device of claim 39, wherein the scanning device comprises a stage to which the specimen holder is mounted, the stage being movable in at least two dimensions relative to the probe.

64. The device of claim 39, configured as a scanning-probe microscope.

65. The device of claim 64, configured as a microscope selected from the group consisting of light microscopes, fluorescence microscopes, confocal laser-scanning microscopes, near-field microscopes, and atomic-force microscopes.

66. The device of claim 39, further comprising a position detector situated and configured to produce positional data for the at least one of the probe and specimen holder at the sample areas.

67. The device of claim 66, further comprising a computer that is configured to receive the positional data for each of the sample areas, to receive the image data, to correlate the image data with respective positional data, and to process the image data to a form usable for producing an image, from the received image data, of the scanned field of view.

68. A device for producing an image of a specimen, comprising:
  a specimen holder configured to hold a specimen;
  a probe configured to be placed relative to the specimen and to facilitate production of respective image data at each sample area at which the probe is situated relative to the specimen;
  a scanning device coupled to at least one of the probe and specimen holder and configured to move the at least one of the probe and specimen holder, relative to the other and within a two-dimensional field of view, in a continuous, non-raster scanning path from sample area to sample area in a serial manner in the field while the respective image data are being produced, the sample areas being distributed substantially uniformly throughout the field so as collectively to cover the field and to provide substantially uniform spatial coverage per sample area in the field;
  a computer configured to receive the image data and to process the image data to a form usable for producing an image, from the received image data, of the scanned field of view, the computer comprising a converter configured to convert the received data, obtained along the non-raster scanning path in the field of view, to a raster space comprising a substantially uniform grid of multiple pixels; and
  a position detector configured to determine respective coordinates associated with each sample area along the scanning path as data are being produced at the respective sample area.

69. The device of claim 68, further comprising a display device coupled to the computer so as to display the pixels in a manner discernible as an image of the field of view.

70. A device for producing an image of a specimen, comprising:
  specimen-holding means for holding a specimen;

probe means, situated relative to the specimen-holding means, for facilitating production of respective image data at each sample area at which the probe means is situated relative to the specimen; and scanning means, coupled to at least one of the probe means and specimen-holding means, for moving the at least one of the probe means and specimen-holding means, relative to the other and within a two-dimensional field of view, in a continuous, non-raster scanning path from sample area to sample area in a serial manner in the field while the respective image data are being produced, the sample areas being distributed substantially uniformly throughout the field so as collectively to cover the field and to provide substantially uniform spatial coverage per sample area in the field.

71. The device of claim 70, further comprising computer means coupled to the scanning means, the computer means being for receiving the image data and for processing the image data to a form usable for producing an image of the scanned field of view.

72. The device of claim 71, wherein the computer means comprises converter means for converting the received data, obtained along the non-raster scanning path in the field of view, to a raster space comprising a substantially uniform grid of multiple pixels.

73. The device of claim 72, further comprising display means for producing an image of the raster space.

74. The device of claim 71, further comprising position-detection means for determining respective coordinates associated with each sample area along the scanning path as data are being produced at the respective sample area.

75. A scanning microscope, comprising:

a specimen holder configured to hold a specimen;

a probe configured to be placed relative to the specimen and to facilitate production of respective image data at each sample area at which the probe is situated relative to the specimen;

a scanning device coupled to at least one of the probe and specimen holder and configured to move the at least one of the probe and specimen holder, relative to the other and within a two-dimensional field of view, in a continuous, non-raster scanning path from sample area to sample area in a serial manner in the field while the respective image data are being produced, the sample areas being distributed substantially uniformly throughout the field so as collectively to cover the field and to provide substantially uniform spatial coverage per sample area in the field;

a computer configured to receive the image data and to process the image data to a form usable for producing an image, from the received image data, of the scanned field of view, the computer comprising a converter configured to convert the received data, obtained along the non-raster scanning path in the field of view, to a raster space comprising a substantially uniform grid of multiple pixels;

a position detector configured to determine respective coordinates associated with each sample area along the scanning path as data are being produced at the respective sample area; and a display coupled to the computer and configured to produce a display of the raster space.

* * * * *

UNITED STATES PATENT AND TRADEMARK OFFICE
CERTIFICATE OF CORRECTION

| | | |
|---|---|---|
| PATENT NO. | : 7,009,172 B2 | Page 1 of 1 |
| APPLICATION NO. | : 10/795205 | |
| DATED | : March 7, 2006 | |
| INVENTOR(S) | : Publicover et al. | |

It is certified that error appears in the above-identified patent and that said Letters Patent is hereby corrected as shown below:

In column 3, line 62, the phrase "of these" should be --these--.
In column 7, line 10, the word "modem" should be --modern--.
In column 9, line 13, the word "may" should be --many--.
In column 9, line 24, the symbol "(Δx)," should be --Δy),--.
In column 9, line 29, the phrase "12B)contains" should be --12B) contains--.

<u>In the Claims:</u>
In column 11, line 67, claim 35, the phrase "of(i)" should be --of (i)--.

Signed and Sealed this

Eighth Day of July, 2008

JON W. DUDAS
*Director of the United States Patent and Trademark Office*